(12) United States Patent
Kim et al.

(10) Patent No.: US 7,615,461 B2
(45) Date of Patent: Nov. 10, 2009

(54) METHOD FOR FORMING SHALLOW TRENCH ISOLATION OF SEMICONDUCTOR DEVICE

(75) Inventors: Seung Bum Kim, Seoul (KR); Jong Kuk Kim, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 11 days.

(21) Appl. No.: 11/944,748

(22) Filed: Nov. 26, 2007

(65) Prior Publication Data
US 2008/0200006 A1    Aug. 21, 2008

(30) Foreign Application Priority Data
Feb. 16, 2007    (KR) ...................... 10-2007-0016362

(51) Int. Cl.
*H01L 21/30* (2006.01)
(52) U.S. Cl. ...................... 438/452; 438/719; 438/732; 257/E21.545; 257/E21.628
(58) Field of Classification Search ................. 438/452, 438/444, 732, 735, 719; 257/E21.642, E21.628, 257/E21.545; 427/255.37; 216/39, 79
See application file for complete search history.

(56) References Cited

U.S. PATENT DOCUMENTS

| 7,118,987 B2 * | 10/2006 | Fu et al. ...................... 438/435 |
| 2002/0132486 A1 * | 9/2002 | Williams et al. ............ 438/712 |

* cited by examiner

*Primary Examiner*—Caridad M Everhart
(74) *Attorney, Agent, or Firm*—Marshall, Gerstein & Borun LLP

(57) ABSTRACT

A method for forming a shallow trench isolation (STI) of a semiconductor device comprises forming a nitride film pattern over a semiconductor substrate having a defined lower structure, etching a predetermined thickness of the semiconductor substrate using the nitride film pattern as a mask to form a trench having a vertical sidewall in a portion of the substrate predetermined to be a device isolation region, performing a plasma treatment process on the sidewall of the trench to form a plasma oxide film, forming an oxide film over the resulting structure to fill the trench, and performing a planarization process over the resulting structure.

13 Claims, 9 Drawing Sheets

METHOD FOR FORMING SHALLOW TRENCH ISOLATION OF SEMICONDUCTOR DEVICE

CROSS-REFERENCE TO RELATED APPLICATION

The priority of Korean patent application number 10-2007-0016362, filed on Feb. 16, 2007, the disclosure of which is incorporated by reference in its entirety, is claimed.

BACKGROUND OF THE INVENTION

The invention relates generally to a method for forming a shallow trench isolation (STI) of a semiconductor device, and more specifically, to a method for forming an STI for a three-dimensional structured transistor to improve integration and operation reliability of the device.

Due to the high degree of integration of memory devices, a three-dimensionally structured cell is formed to increase the length of channels. Specifically, a recess gate structure where a gate part is formed in an active region is formed to increase channel length.

In the above-described structure, it is important to control the presence of a pointed silicon horn that may remain in the semiconductor substrate of a boundary portion of an active region and a device isolation region.

SUMMARY OF THE INVENTION

Various embodiments of the invention are directed at providing a method for forming an STI of a semiconductor device without generating a void when an STI oxide film gap is filled and a horn when a recess gate is formed in a subsequent process.

According to an embodiment of the invention, a method for forming a shallow trench isolation (STI) of a semiconductor device comprises: forming a nitride film pattern over a semiconductor substrate having a defined lower structure; etching a predetermined thickness of the semiconductor substrate using the nitride film pattern as a mask to form a trench having a vertical sidewall in a portion of the substrate predetermined to be a device isolation region; performing a plasma treatment process on the sidewall of the trench to form a plasma oxide film; forming an oxide film over the resulting structure to fill the trench; and performing a planarization process over the resulting structure.

The trench is preferably formed in a reaction furnace having a pressure ranging from 5 mT to 30 mT, preferably with a mixture gas comprising hydrogen bromide gas, chlorine gas, and oxygen gas as an etching gas. The etching gas preferably comprises chlorine gas in an amount ranging from 10 to 50 parts by volume and oxygen gas in an amount from 1 to 25 parts by volume based on 100 parts by volume of the hydrogen bromide gas. The amount of the hydrogen bromide gas may be decreased and the amount of the chlorine gas may be increased in the etching gas so that the shape of the trench is changed from convex into concave.

The trench is preferably formed with a plasma source power ranging from 500 W to 1500 W and a bias power ranging from 0 W to 500 W. The plasma source power may be increased and the bias power may be reduced so that the shape of the trench is changed from convex into concave.

The plasma oxide film is preferably formed using a plasma selected from the group consisting of microwave plasma, electron cyclotron resonance plasma, inductively coupled plasma, transformer coupled plasma and capacitively coupled plasma. The plasma oxide film is preferably formed in a reaction furnace having a pressure ranging from 100 mT to 1000 mT. The plasma oxide film is preferably formed with a mixture gas comprising hydrogen bromide gas, nitrogen gas, and a fluorine-containing gas as an oxidation gas. The oxidation gas preferably includes nitrogen gas in an amount ranging from 1 to 10 parts by volume and a fluorine-containing gas in an amount from 0.1 to 5 parts by volume based on 100 parts by volume of the hydrogen bromide gas.

The plasma oxide film is preferably formed with a plasma source power ranging from 500 W to 1500 W.

DETAILED DESCRIPTION OF A SPECIFIC EMBODIMENT

FIGS. 1a through 1e are cross-sectional diagrams illustrating a conventional method for forming an STI of a semiconductor device.

Figure 1A:
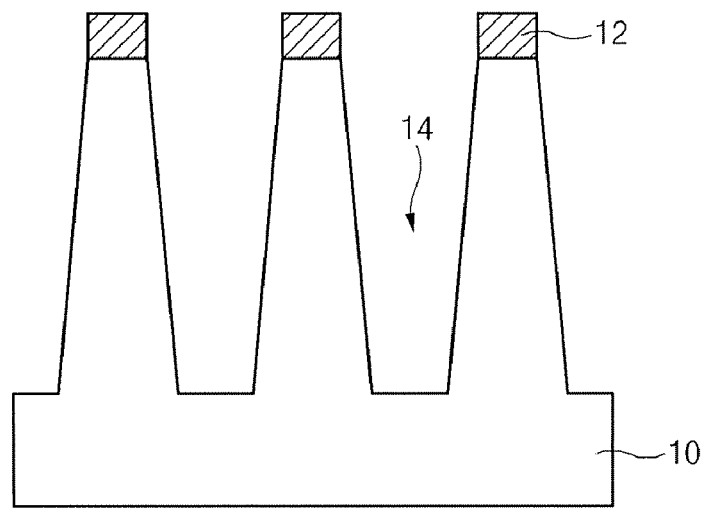
FIGS. 1a through 1e are cross-sectional diagrams illustrating a conventional method for forming an STI of a semiconductor device.

Referring to FIG. 1a, a thermal oxidation process is performed to form a pad oxide film (not shown) over a semiconductor substrate 10 and a pad nitride film (not shown) over the pad oxide film. The pad nitride film is used as a hard mask when a trench is etched.

The pad nitride film is selectively etched by a photo etching process with a device isolation mask to form a nitride film pattern 12. The pad oxide film and the semiconductor substrate 10 are etched with the nitride film pattern 12 as a hard mask to form a trench 14 in a portion of the substrate 10 predetermined to be a device isolation region.

Figure 1B:
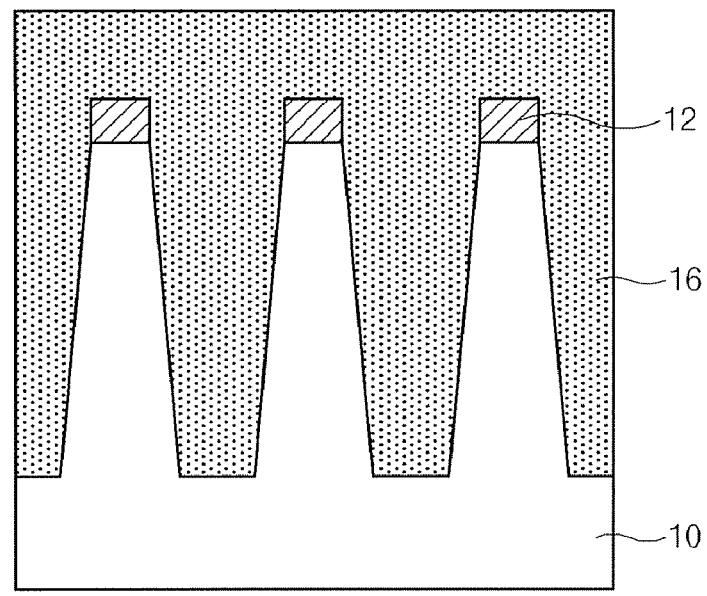

Referring to FIG. 1b, an STI oxide film 16 for filling the trench 14 is formed over the resulting structure.

Figure 1C:
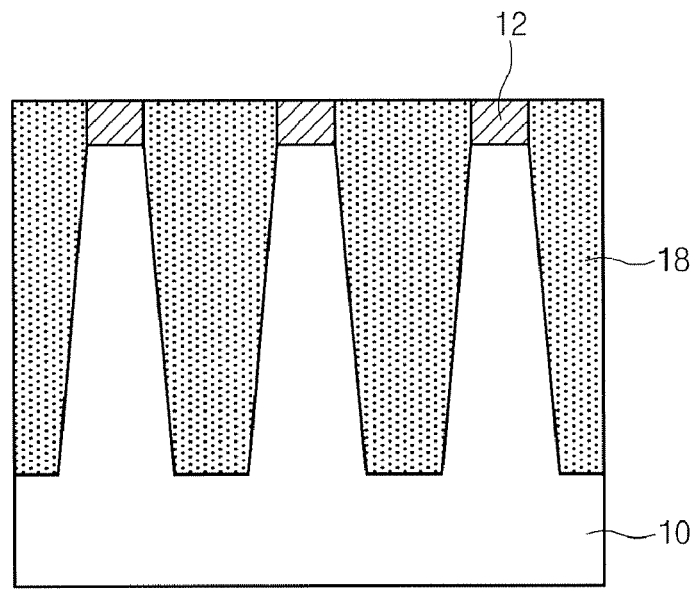

Referring to FIG. 1c, a CMP process is performed to planarized the STI oxide film 16, thereby forming an STI type device isolation film 18.

Figure 1D:
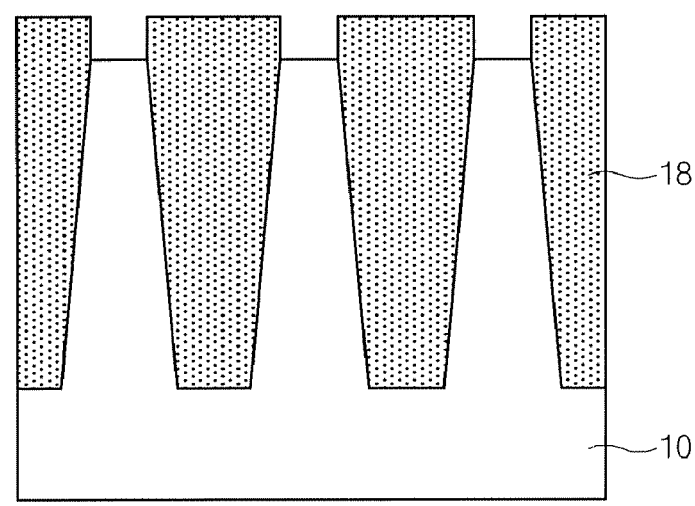

Referring to FIG. 1d, a wet etching process is performed with HF or Buffered Oxide Etchant (BOE, NH$_4$F+HF) to remove the nitride film pattern 12.

Figure 1E:
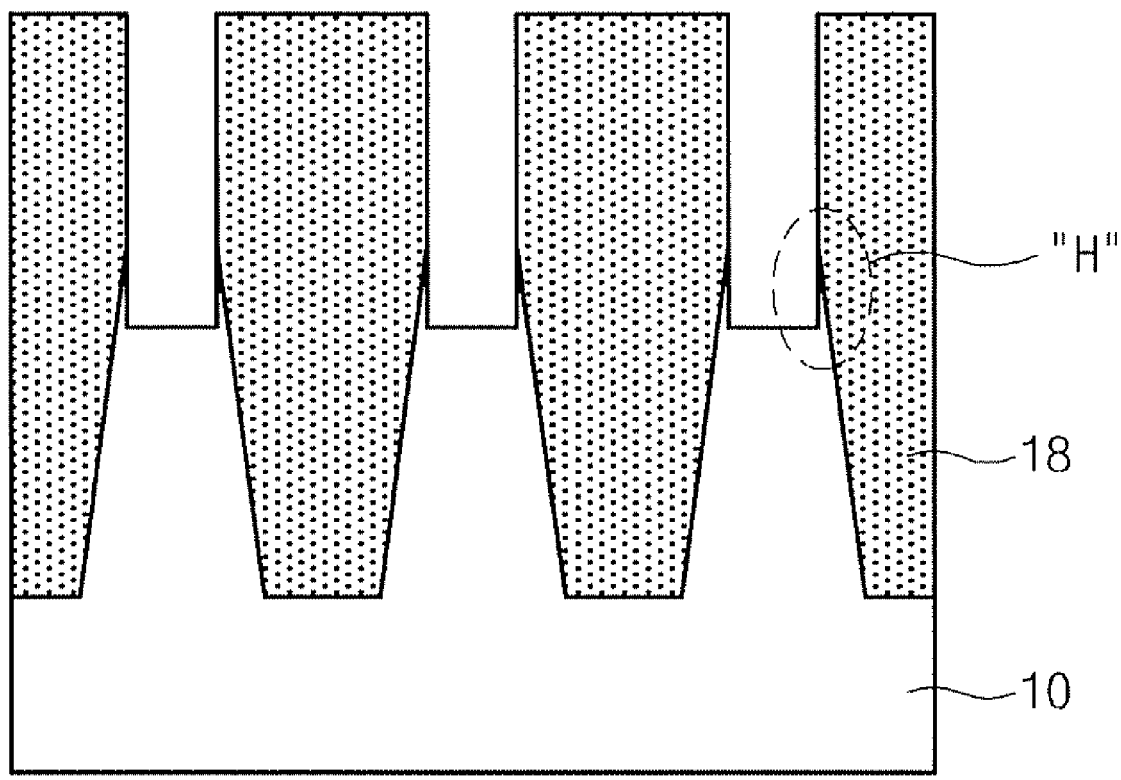
Figure 2:
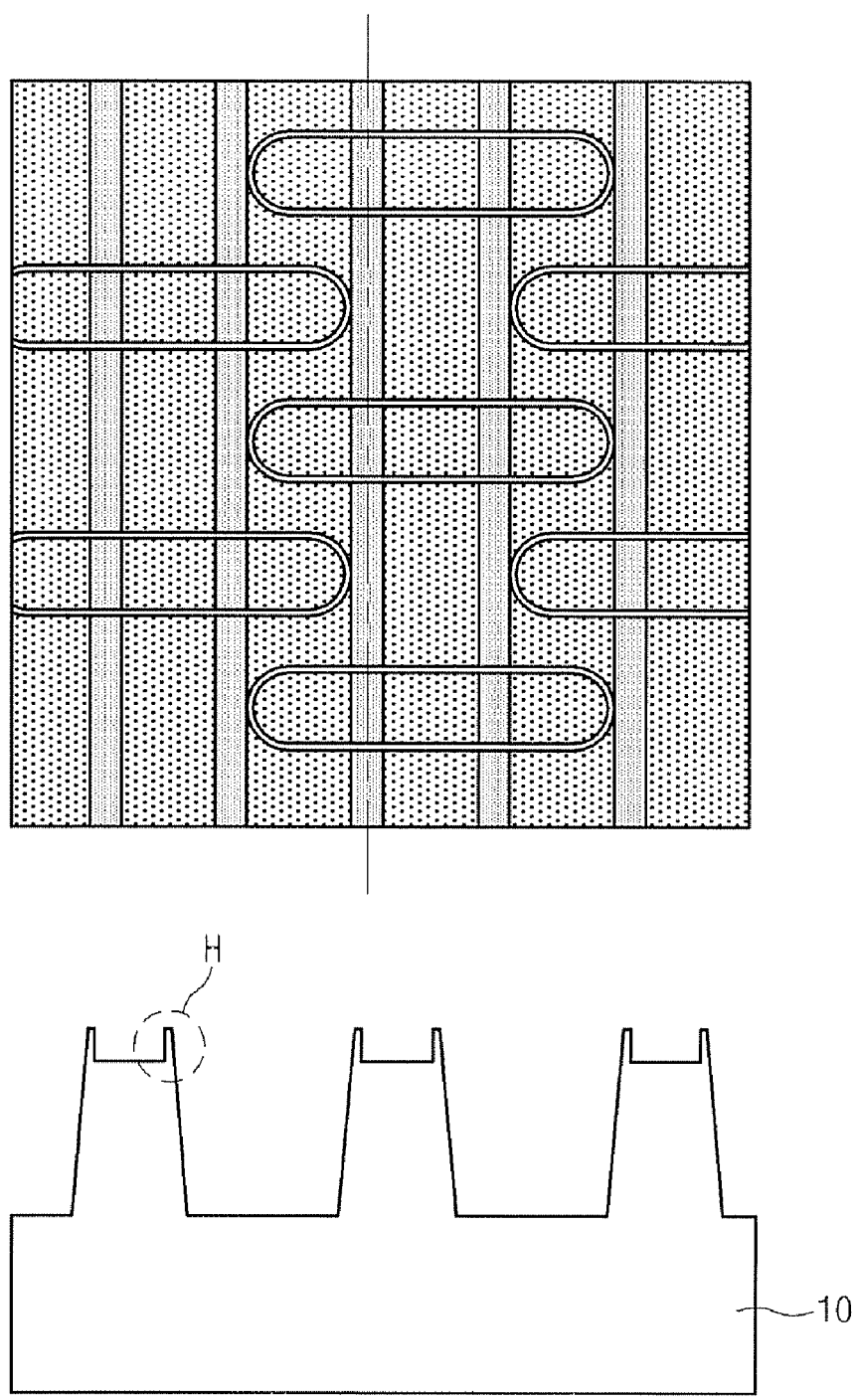
FIG. 2 illustrates an STI etch profile and a horn (H) shape after etching a recess gate.

Referring to FIG. 1e, the semiconductor substrate 10 is isotropically etched with a plasma for forming a recess gate. In the semiconductor substrate 10, an upper portion is smaller than a lower portion to generate a horn (H) wherein the semiconductor substrate 10 of the active region becomes pointed in a boundary portion of the active region and the device isolation region. FIG. 2 illustrates an STI profile and a horn (H) shape after etching a recess gate.

Threshold voltage of the device is increased by an increase in the height of the horn (H), and an operating characteristic of the transistor is thereby degraded.

In order to decrease the height of the horn (H), the semiconductor substrate 10 may be etched to form the trench 14 so that the active region of the semiconductor substrate 10 has a concave profile.

Figure 3A:
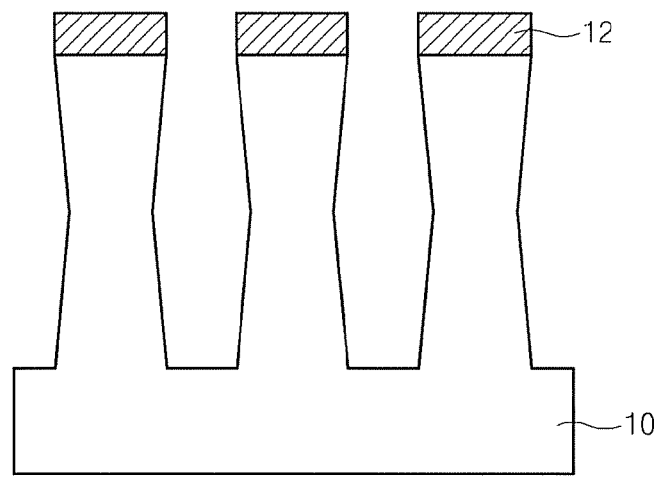
FIGS. 3a and 3b are cross-sectional diagrams illustrating a conventional method for forming an STI of a semiconductor device.
Figure 3B:
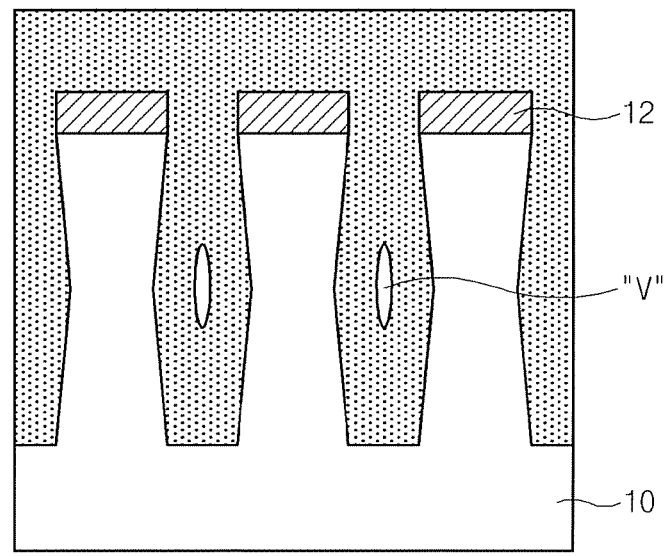

FIGS. 3a and 3b are cross-sectional diagrams illustrating a conventional method for forming an STI of a semiconductor device.

Referring to FIG. 3a, the semiconductor substrate 10 is etched to form the trench 14 with an etching gas comprising chlorine ($Cl_2$) gas, hydrogen bromide (HBr) gas, and oxygen ($O_2$) gas. The respective amounts of the chlorine ($Cl_2$) gas, the hydrogen bromide (HBr) gas, and the oxygen ($O_2$) gas are regulated. Also, a plasma source power and a bias power are regulated so that the profile of the active region of the semiconductor substrate 10 becomes concave, as shown in FIG. 3a.

Referring to FIG. 3b, after the STI oxide film 16 is deposited over the resulting structure, a gap is not completely filled resulting in generation of a void (V). The void (V) adversely affects isolation between transistors so that the transistors are not operable.

FIGS. 4a through 4f are cross-sectional diagrams illustrating a method for forming an STI of a semiconductor device according to an embodiment of the invention.

Figure 4A:
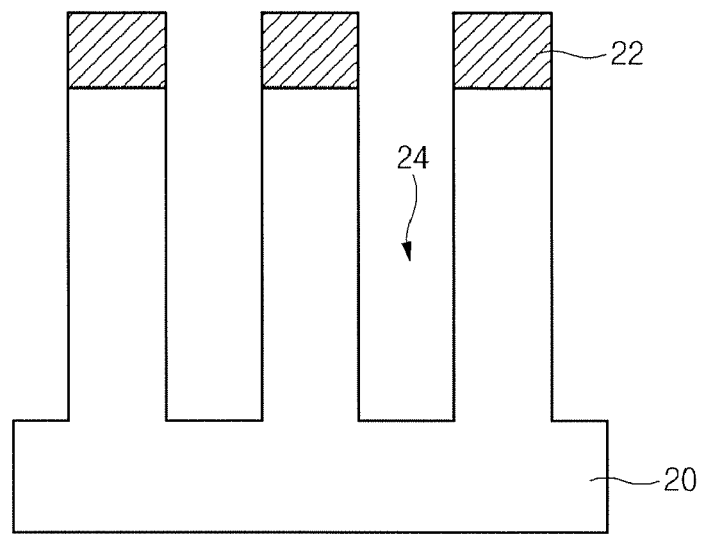
FIGS. 4a through 4f are cross-sectional diagrams illustrating a method for forming an STI of a semiconductor device according to an embodiment of the invention.

Referring to FIG. 4a, a thermal oxidation process is performed to form a pad oxide film (not shown) over a semiconductor substrate 20. When a trench is etched, a pad nitride film (not shown) used as a hard mask is formed.

The pad nitride film is selectively etched by a photo etching process using a device isolation mask to form a nitride film pattern 22. The pad oxide film and the semiconductor substrate 20 are etched with the nitride film pattern 22 as a mask to form a trench 24 having a vertical sidewall in a portion predetermined to be a device isolation region.

The pressure of a reaction furnace in the etching process for forming the trench 24 preferably ranges from 5 mT to 30 mT.

As an etching gas for forming the trench 24, a mixture gas preferably comprising hydrogen bromide (HBr) gas, chlorine ($Cl_2$) gas, and oxygen ($O_2$) gas is used. The etching gas preferably comprises chlorine gas in an amount ranging from 10 to 50 parts by volume and oxygen gas in an amount from 1 to 25 parts by volume based on 100 parts by volume of the hydrogen bromide gas.

The amount of the hydrogen bromide gas may be decreased and the amount of the chlorine gas may be increased in the etching gas so that the shape of the trench 24 becomes concave (for example, changing in shape from convex). The respective amounts of the hydrogen bromide gas and the chlorine gas may be regulated, preferably within the above described volume range, to obtain the trench 24 having a vertical sidewall.

The amount of the oxygen gas may be regulated so that the bottom surface of the trench 24 is formed to be circular in shape.

The trench 24 is preferably formed with a plasma source power ranging from 500 W to 1500 W and a bias power ranging from 0 W to 500 W.

The plasma source power may be increased and the bias power may be reduced so that the shape of the trench 24 becomes concave (for example, changed in shape from convex). The plasma source power and the bis power may be regulated, preferably within the above-described range, to obtain the trench 24 having a vertical sidewall.

Figure 4B:
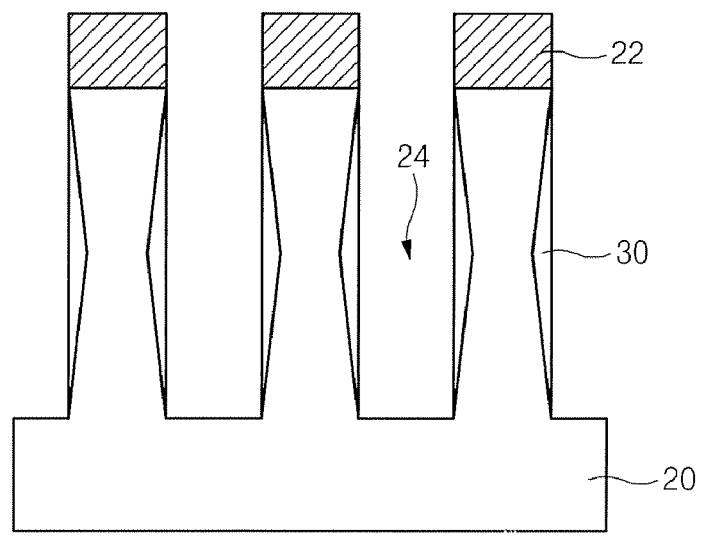

Referring to FIG. 4b, a plasma treatment process is performed to form a plasma oxide film 30 at the sidewall of the trench 24.

The plasma treatment process is preferably performed using a plasma selected from the group consisting of microwave plasma, electron cyclotron resonance plasma, inductively coupled plasma, transformer coupled plasma, and capacitively coupled plasma. A pressure of a reaction furnace preferably ranges from 100 mT to 1000 mT.

As an oxidation gas in the plasma treatment process, a mixture gas comprising oxygen gas, nitrogen gas and a fluorine-containing gas is preferably used. The oxidation gas preferably comprises nitrogen gas in an amount ranging from 1 to 10 parts by volume and a fluorine-containing gas in an amount from 0.1 to 5 parts by volume based on 100 parts by volume of the oxygen gas.

The fluorine containing gas is preferably selected from the group consisting of $CF_4$ gas, $SF_6$ gas, and $CHF_3$.

The plasma treatment process is preferably performed with a plasma source power ranging from 500 W to 1500 W.

The plasma oxide film 30 is relatively thinly formed in the top and bottom portions of the vertical sidewall of the trench 24, and relatively thickly formed in the middle portion of the sidewall of the trench 24. As a result, the shape of the active region of the semiconductor substrate 20 is concave.

Figure 4C:
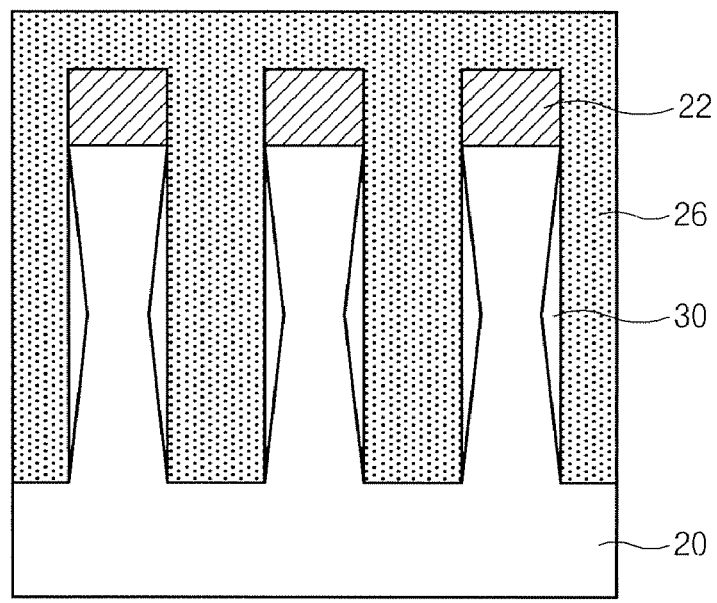

Referring to FIG. 4c, an STI oxide film 26 for filling the trench 24 is formed over the resulting structure, without generating a void, by gap filling.

Figure 4D:
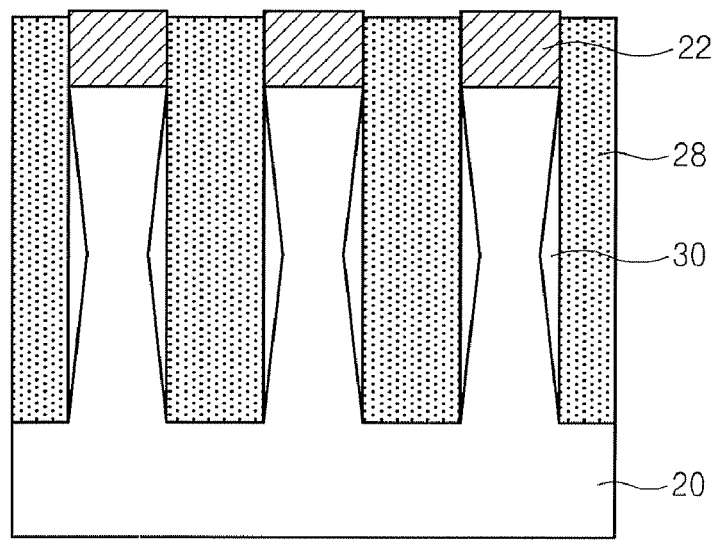

Referring to FIG. 4d, a CMP process is performed to planarize the STI oxide film 26, thereby obtaining an STI type device isolation film 28.

Figure 4E:
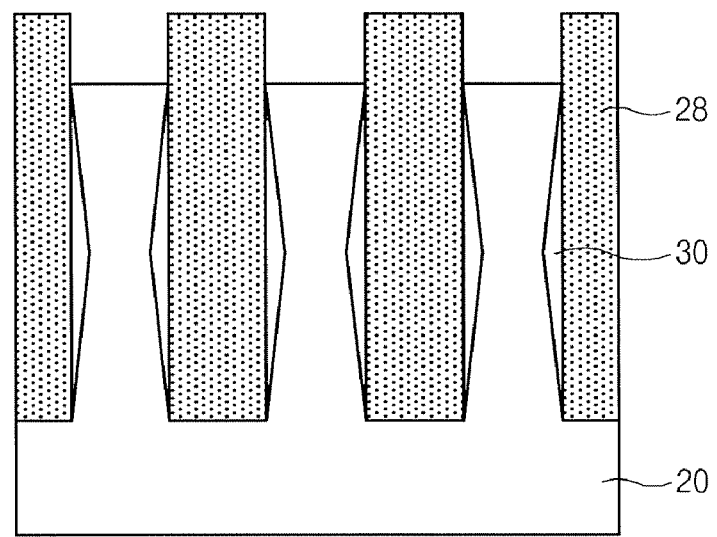

Referring to FIG. 4e, a wet etching process is performed preferably using HF or Buffered Oxide Etchant (BOE, $NH_4F$+HF) to remove the nitride film pattern 22.

Figure 4F:
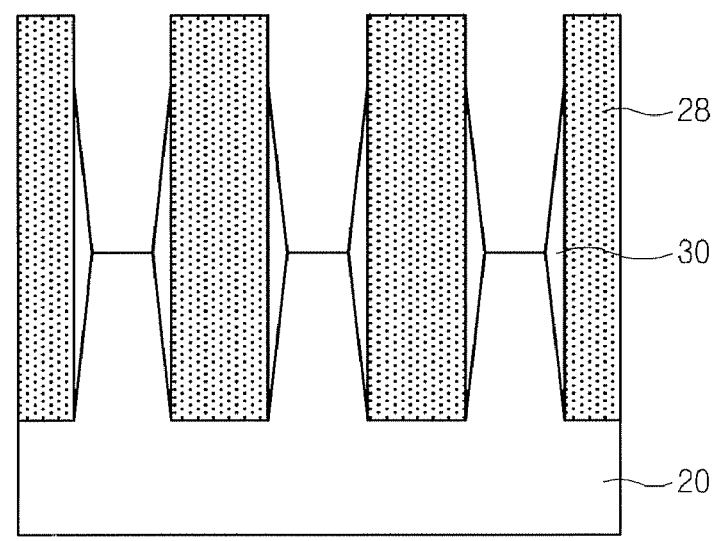

Referring to FIG. 4f, the semiconductor substrate 20 is isotropically etched with a plasma to form a recess gate. As a result, a pointed horn in a boundary portion of the active region and the device isolation region is not generated.

Figure 5:
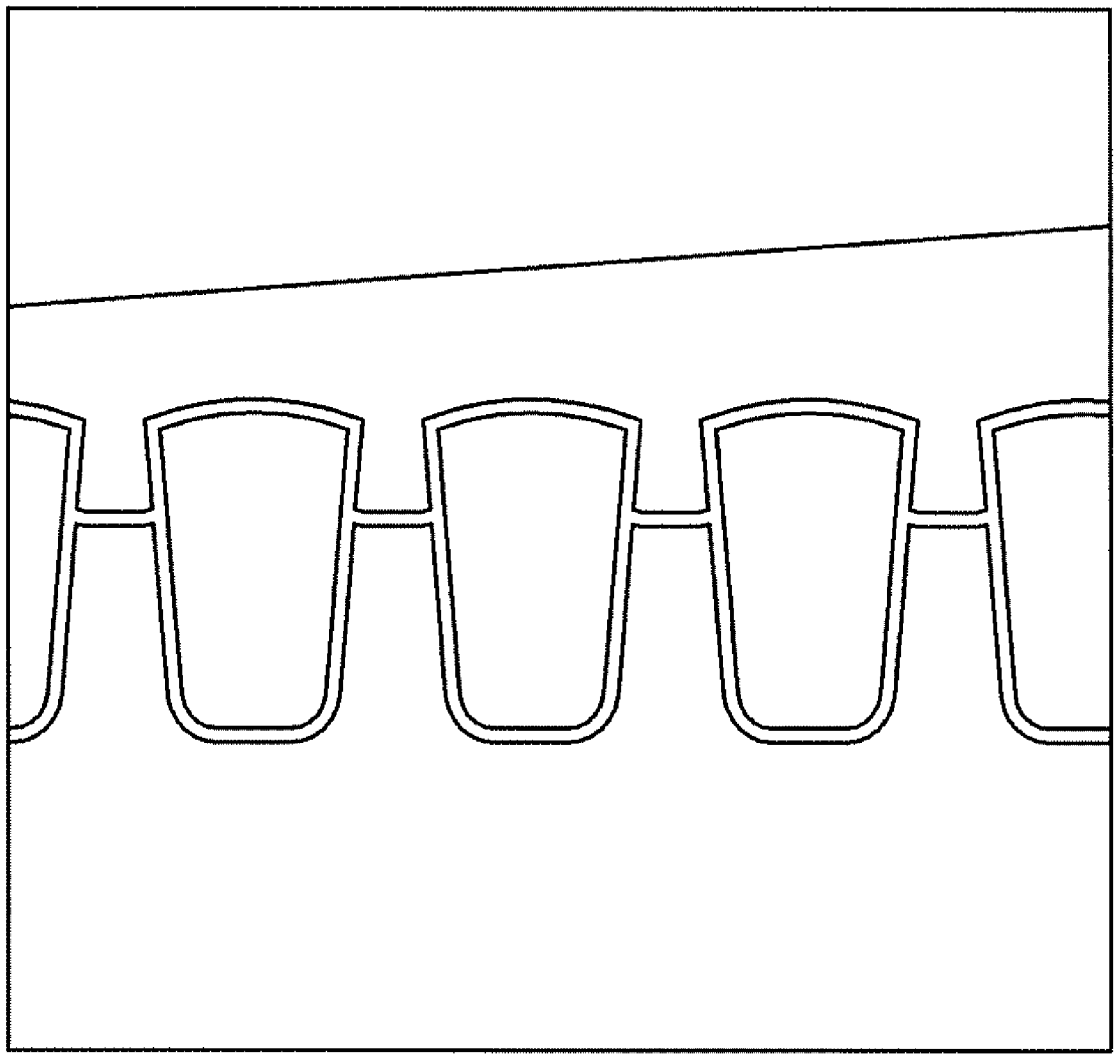
FIG. 5 is an SEM photograph illustrating a resulting structure formed by a method for forming an STI of a semiconductor device according to an embodiment of the invention.

FIG. 5 is an SEM photograph illustrating a resulting structure formed by a method for forming an STI of a semiconductor device according to an embodiment of the invention.

As described above, in a method for forming an STI of a semiconductor device according to an embodiment of the invention, a void is not generated in a process for depositing an STI oxide film when an STI is formed for a three-dimensional structured transistor. Also, a horn is not generated when a recess gate is formed in a subsequent process, thereby improving integration and operation reliability of the device to improve productivity and yield.

The above embodiments of the invention are illustrative and not limiting. Various alternatives and equivalents are possible. The invention is not limited by the lithography steps described herein, nor is the invention limited to any specific type of semiconductor device. For example, the invention may be implemented in a dynamic random access memory (DRAM) device or non volatile memory device. Other additions, subtractions, or modifications are intended to fall within the scope of the appended claims.

What is claimed is:

1. A method for forming a shallow trench isolation (STI) of a semiconductor device, the method comprising:

forming a nitride film pattern over a semiconductor substrate having a defined lower structure;

etching a predetermined thickness of the semiconductor substrate using the nitride film pattern as a mask to form a trench having a vertical sidewall in a portion of the substrate predetermined to be a device isolation region;

forming a plasma oxide film only on sidewalls of the trench by performing a plasma treatment process;

forming an oxide film over the resulting structure to fill the trench; and performing a planarization process over the resulting structure.

2. The method according to claim 1, wherein the etching process is performed in a reaction furnace having a pressure ranging from 5 mT to 30 mT.

3. The method according to claim 1, wherein the plasma treatment process is performed by using a plasma selected from the group consisting of microwave plasma, electron cyclotron resonance plasma, inductively coupled plasma, transformer coupled plasma, and capacitively coupled plasma.

4. The method according to claim 1, wherein the plasma treatment process is performed in a reaction furnace having a pressure ranging from 100 mT to 1000 mT.

5. The method according to claim 1, wherein the plasma treatment process is performed with a plasma source power ranging from 500 W to 1500 W.

6. The method according to claim 1, wherein the etching process is performed with a mixture gas comprising hydrogen bromide (HBr) gas, chlorine ($Cl_2$) gas, and oxygen ($O_2$) gas as an etching gas.

7. The method according to claim 6, wherein the etching gas comprises chlorine gas in an amount ranging from 10 to 50 parts by volume and oxygen gas in an amount from 1 to 25 parts by volume based on 100 parts by volume of the hydrogen bromide gas.

8. The method according to claim 6, wherein the shape of the trench is controlled by selecting respective amounts of the hydrogen bromide gas and the chlorine gas in the etching gas so as to form a concave trench.

9. The method according to claim 1, wherein the etching process is performed with a plasma source power ranging from 500 W to 1500 W and a bias power ranging from 0 W to 500 W.

10. The method according to claim 9, wherein the shape of the trench is controlled by selecting the plasma source power and the bias power to form a concave trench.

11. The method according to claim 1, wherein the plasma treatment process is performed with a mixture gas including oxygen gas, nitrogen gas and a fluorine-containing gas as an oxidation gas.

12. The method according to claim 11, wherein the fluorine-containing gas is selected from the group consisting of $CF_4$ gas, $SF_6$ gas, and $CHF_3$.

13. The method according to claim 11, wherein the oxidation gas comprises nitrogen gas in an amount ranging from 1 to 10 parts by volume and a fluorine-containing gas in an amount from 0.1 to 5 parts by volume based on 100 parts by volume of the oxygen gas.

* * * * *